(12) United States Patent
Moharir (10) Patent No.: US 9,490,008 B1
(45) Date of Patent: *Nov. 8, 2016

(54) 9T, 8T, AND 7T BITCELLS FOR 1R1W AND SINGLE PORT STATIC RANDOM ACCESS MEMORIES (SRAM) WITH SINGLE-ENDED READ AND SINGLE-ENDED WRITE

(71) Applicant: Skan Technologies Corporation, Willowbrook, IL (US)

(72) Inventor: Sudhir S. Moharir, Bangalore (IN)

(73) Assignee: SKAN TECHNOLOGIES CORPORATION, Willowbrook, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/976,065

(22) Filed: Dec. 21, 2015

Related U.S. Application Data

(63) Continuation-in-part of application No. 14/519,468, filed on Oct. 21, 2014, now Pat. No. 9,336,861.

(60) Provisional application No. 62/036,189, filed on Aug. 12, 2014, provisional application No. 62/098,460, filed on Dec. 31, 2014, provisional application No. 62/097,270, filed on Dec. 29, 2014.

(51) Int. Cl.
*G11C 11/419* (2006.01)
*G11C 11/418* (2006.01)

(52) U.S. Cl.
CPC ............ *G11C 11/419* (2013.01); *G11C 11/418* (2013.01)

(58) Field of Classification Search
CPC ........................... G11C 11/419; G11C 11/418
See application file for complete search history.

(56) References Cited

U.S. PATENT DOCUMENTS

| | | | | |
|---|---|---|---|---|
| 6,674,660 | B2 * | 1/2004 | Shau | G11C 15/04 365/156 |
| 7,064,971 | B2 * | 6/2006 | Shau | G11C 15/04 365/195 |
| 8,289,754 | B2 * | 10/2012 | Lee | G11C 11/412 365/154 |
| 8,958,232 | B2 * | 2/2015 | Chang | G11C 7/067 365/154 |

* cited by examiner

*Primary Examiner* — Hoai V Ho
*Assistant Examiner* — Tri Hoang
(74) *Attorney, Agent, or Firm* — Anderson Gorecki LLP (57) ABSTRACT

The present patent application describes 9T, 8T, and 7T versions of bitcells used with 1R1W memories. It also describes 9T, 8T, and 7T versions of bitcells used with single port SRAM memories. Different circuits are discussed to support different bitcells and architectures mentioned above. Our 1R1W and single port bitcells and architectures give significant advantages over the conventional bitcells and architectures.

12 Claims, 14 Drawing Sheets

9T, 8T, AND 7T BITCELLS FOR 1R1W AND SINGLE PORT STATIC RANDOM ACCESS MEMORIES (SRAM) WITH SINGLE-ENDED READ AND SINGLE-ENDED WRITE

CROSS REFERENCE TO RELATED APPLICATIONS

The present application is a Continuation-In-Part of U.S. patent application Ser. No. 14/519,468, filed on Oct. 21, 2014 which claims priority to U.S. Provisional Patent Application No. 62/036,189 filed on Aug. 12, 2014, U.S. Provisional Patent Application No. 62/098,460 filed on Dec. 31, 2014, and U.S. Provisional Patent 62/097,270 filed on Dec. 29, 2014, all of which are incorporated herein by reference in their entirety.

BACKGROUND

Traditional memory bit cells are well known and widely used. In a conventional six transistor (6T) bitcell, in order to write into the bitcell, a Write Line (WL) needs to go high and the zero is written either from the Bit Line (BL) or the Bit Line Bar (BLB) side by pulling either the BL or the BLB low depending on the data. The READ happens by sensing the differential between the BL and BLB when the WL goes high. In a conventional eight transistor (8T) bitcell the WRITE operation is same as in the 6T bitcell. The READ operation happens when the RWL goes high. The RBL is precharged high. If the node B is high, then the RBL will go low, otherwise it will stay high.

SUMMARY

In the earlier memory bitcell architectures, in order to accomplish a write to the bit cell, a write bitline, a write column mux comprised of the NMOS pass transistors, and a write driver were required. As the write driver had to drive the bitline through the write mux pass transistor, the size of the write driver needed to be bigger and the statistical analysis had to be carried out on the combination of bitline RC, write mux and the write driver. This increased the problem of writing into the bitcell and contributed to the necessity of the write-assist techniques. In accordance with the present invention, the writing into the bitcell is now made simple and local to the bitcell, and there would be many technology nodes where the necessity of the write-assist techniques will not be there. So we have also taken care of the write-assist requirement.

In the previous patents with Ser. Nos. 62/036,189 and 14/519,468, a 9T bitcell for 1R1W (One Read One Write) SRAM memories with single-ended read and single-ended write was described.

Conventional memory bit cells suffer from a number of deficiencies as recited above. Embodiments of the invention significantly overcome such deficiencies by providing a bitcell and memory architecture without a write bitline.

The U.S. Provisional Patent application No. 62/098,460 filed on Dec. 31, 2014 describes 9T, 8T and 7T versions of bitcells used with SRAM memories which can be used in place of conventional bitcells. In the 9T Bitcell a WD (Wordline Driver) ships out signals WWL (Write Word Line) and RWL (Read Word Line). In the 8T Bitcell a WD (Wordline Driver) ships out signals RWL (Read Word Line) and either WWLXPD (Write Word Line Tri-statatble Pull Down) or WWLB (Write Word Line Bar). In the 7T Bitcell a WD (Wordline Driver) ships out either WWLXPD (Write Word Line Tri-statable Pull Down) or WWLB (Write Word Line Bar) and either RWLXPD (Read Word Line Tri-statable Pull Down) or RWLB (Read Word Line Bar). Different circuits are needed to support different bitcells and architectures mentioned above.

When migrating from 9T to 8T to 7T bitcells, the bitcell area reduces. Also, as the WWLB and RWLB invertors or the WWLXPD and RWLXPD transistors can be sized as per the design requirements, we can optimize the READ and WRITE performance. In summary, the proposed new bitcells and the memory architectures bring a huge improvement in the performance, dynamic power, leakage power, area, and the yield of the memory.

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention. The drawings are not necessarily to scale, emphasis instead being placed upon illustrating the principles of the invention.

DETAILED DESCRIPTION

The embodiments set forth below represent the necessary information to enable those skilled in the art to practice the invention and illustrate the best mode of practicing embodiments of the invention. Upon reading the following description in light of the accompanying figures, those skilled in the art will understand the concepts of the invention and recognize applications of these concepts not particularly addressed herein. It should be understood that these concepts and applications fall within the scope of the disclosure and the accompanying claims.

The preferred embodiment of the invention will now be described with reference to the accompanying drawings. The invention may, however, be embodied in many different forms and should not be construed as limited to the embodiment set forth herein; rather, this embodiment is provided so that this disclosure will be thorough and complete, and will fully convey the scope of the invention to those skilled in the art. The terminology used in the detailed description of the particular embodiment illustrated in the accompanying drawings is not intended to be limiting of the invention. In the drawings, like numbers refer to like elements.

Figure 1:
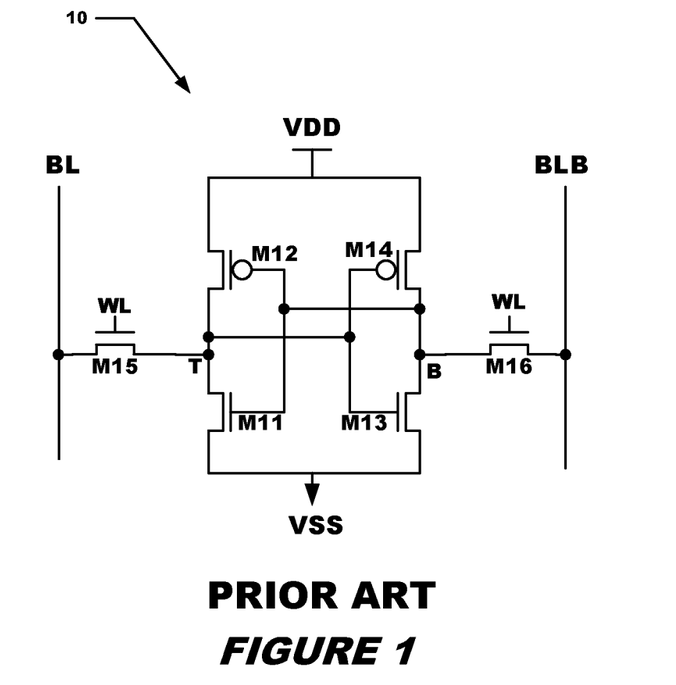
FIG. 1 depicts a schematic diagram of a conventional 6T bitcell.

FIG. 1 shows a conventional 6T bitcell. To write into the bitcell, the WL needs to go high and the zero is written either from the BL or the BLB side by pulling either the BL or the BLB low depending on the data. The READ happens by sensing the differential between the BL and BLB when the WL goes high.

Figure 2:
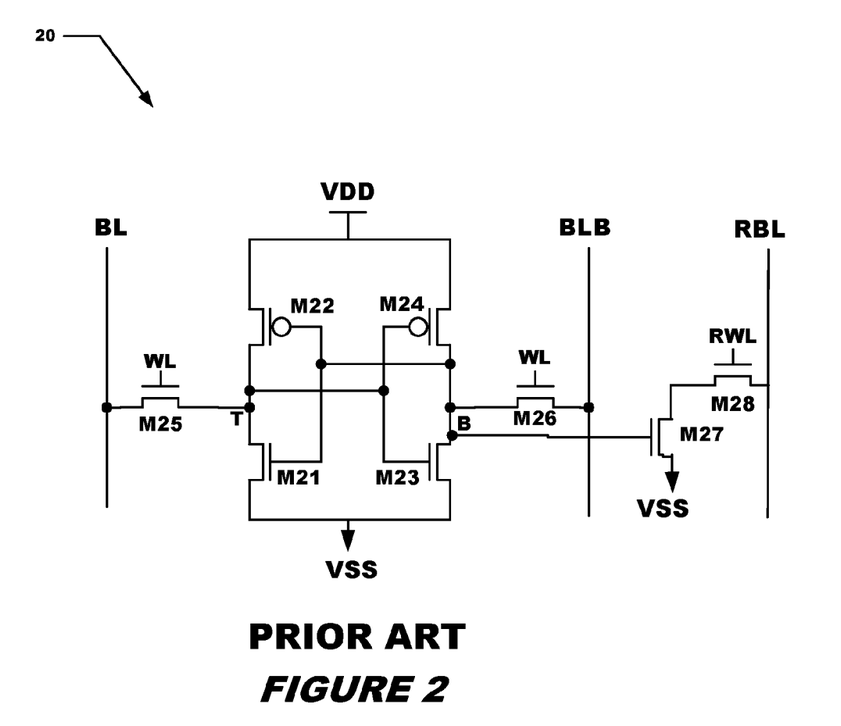
FIG. 2 depicts a schematic diagram of a conventional 8T bitcell.

FIG. 2 shows a conventional 8T bitcell. The WRITE operation is same as in the 6T bitcell. The READ operation happens when the RWL goes high. The RBL is precharged high. If the node B is high, then the RBL will go low, otherwise it will stay high.

Figure 3:
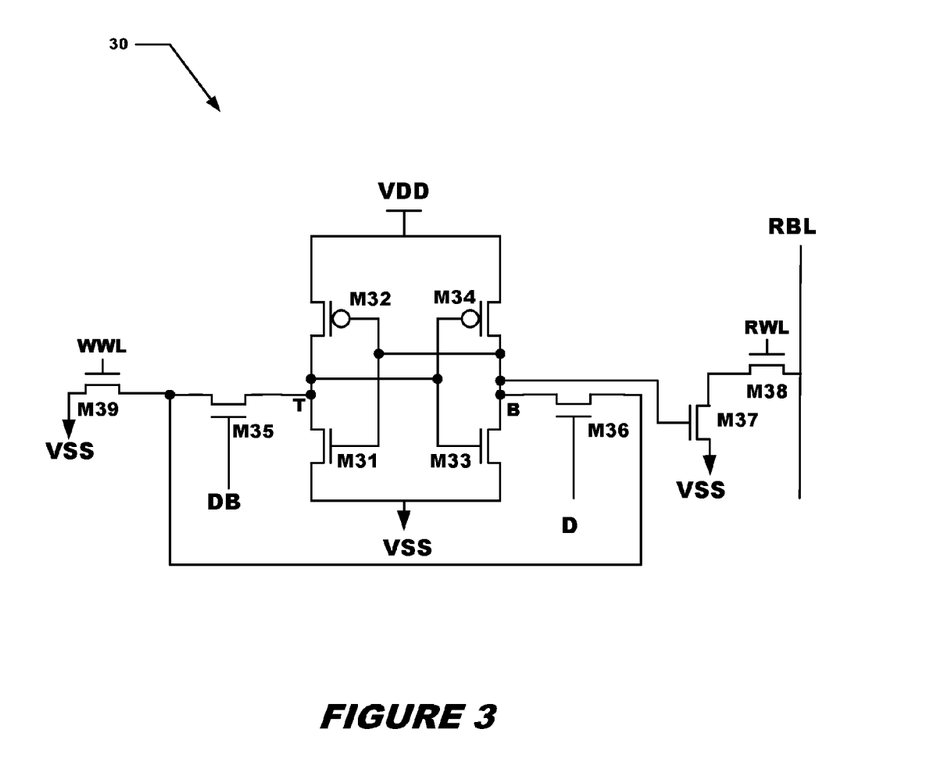
FIG. 3 depicts a schematic diagram of a 1R1W 9T bitcell in accordance with a particular embodiment of the present invention.

FIG. 3 shows the 1R1W 9T (Nine Transistors) bitcell. When neither READ nor WRITE operation is happening, WWL (Write Word Line), DB (Data Bar), D (Data), and RWL (Read Word Line) are kept low. The READ operation stays the same as in FIG. 2. Note that there are no bitlines present related to the WRITE operation. To write into the bitcell, the WWL needs to go high and either DB or D will go high, depending on the data polarity. One end of the transistor M39 is always connected to the VSS. If WWL and DB are high, then the node T will be pulled low. If WWL and D are high, then the node B will be pulled low. This is how we write into the bitcell. The WRITE operation is made local to the individual bitcell. Note that a conventional write driver is not required. A conventional write bitline is not required. Write bitline precharge is not required. Even during a WRITE operation, either T or B will be exposed to the outside influence. Other bitcells on the same wordline WWL are not exposed to the outside influence because for those bitcells, both DB and D will be OFF. In the conventional bitcells, both T and B for all the bitcells on the wordline are exposed to the outside influence. Note that the D and DB signals which control the write pass transistors of the 9T bitcell will have the "data" and the column address information encoded in them.

In that invention, we have discussed a new bitcell to store the data in SRAMs. This bitcell does not have a "write bitline" that is used to write into the bitcell as in all the previous bitcells. As the bitline itself is not required, we do not need a write driver and the circuitry related to the bitline precharge. The memory architectures using this new bitcell will not require a write driver as well as the precharge circuitry related to the write bitline. This saves a lot of area that would otherwise be occupied by this circuitry. As the bitline is not there, the issue of the bitline leakage is also not there. As the bitline is not there, the dynamic power that is consumed in the charging and discharging of the bitline is also not consumed. So in short, we see that we are saving area, dynamic power, and leakage power. As the writing happens locally in the bitcell, it is faster and more robust. This means that we see speed improvement in the write operation and we also see an improvement in the robustness of the write operation.

In the earlier architectures, one needed a write bitline, write column mux that comprised of the NMOS pass transistors, and a write driver. As the write driver had to drive the bitline through the write mux pass transistor, it's size needed to be bigger and the statistical analysis had to be carried out on the combination of bitline RC, write mux and the write driver. This increased the problem of writing into the bitcell and contributed to the necessity of the write-assist techniques. As the writing into the bitcell is now made simple and local to the bitcell, there would be many technology nodes where the necessity of the write-assist techniques will not be there. So we have also taken care of the write-assist requirement.

In the conventional memory bitcell and the architectures, one has to have circuitry that uses the techniques to take care of the read-disturb conditions. This is becoming more and more necessary in the latest technologies. Read-disturb condition happens when the wordline turns ON for a given row and the column is not selected. The problem is increased if the unselected bitline is held high as we are not writing from that column. As the wordline turns ON, the node "B" rises due to the voltage divider action between the passgate and the pulldown of the bitcell. In the recent bitcells where the beta ratio (size of pulldown/size of passgate) of the bitcell is reducing, this problem becomes more critical. In the proposed bitcell and the memory architecture, the read-disturb problem does not exist. Throughout the whole array, only the single bitcell that is being written into, is exposed to the outside influence. Rest of the bitcells are completely stable as either the wordline (WL) or the dataline (D) and datalinebar (DB) are OFF. So the proposed bitcell and the memory architecture are immune to the problem of the read-disturb. This means that the memory is more robust and the circuitry related to the read-disturb is not required, therefore saving the area.

As explained in the above paragraph, the bitcell is immune to the read-disturb condition. In the earlier bitcells, the pulldown transistor needed to be big to maintain a minimum beta ratio so that the bitcell is stable. In the proposed bitcell, as the requirement of a bigger pulldown is not there, the size of the pulldown can be reduced; this will result in a smaller bitcell.

As you see from FIG. 3, there is only one pass transistor per bitcell that is connected to the write wordline (WWL). In conventional bitcells, there are two pass transistors per bitcell that are connected to the wordline (WL). This reduces the load on the wordline to almost half and in many cases, more than half. This will reduce the size of the wordline driver circuitry and also will make the memory faster.

As writing into the bitcell becomes more robust, we expect that the VMIN of the memory will go down. It means that the memories will be functional at a lower voltage as compared to the conventional bitcells. This is a great advantage, particularly for technologies that operate at lower supply voltages.

With this 9T architecture, there is no need to safeguard against the "margins" that were required in the earlier architectures like: 1) WL ON to bitline precharge OFF, 2) Bitline precharge ON to WL OFF, 3) Data arriving at the bitline versus the write select in the column mux, etc. These margins used to effectively slow down the memories. The proposed new architecture will be faster as these margins do not exist.

Keeping in mind this 9T bitcell architecture achievement, we trust that the 8T bitcell and the 7T bitcell that we have now developed will improve on the area of the bitcell.

Figure 4:
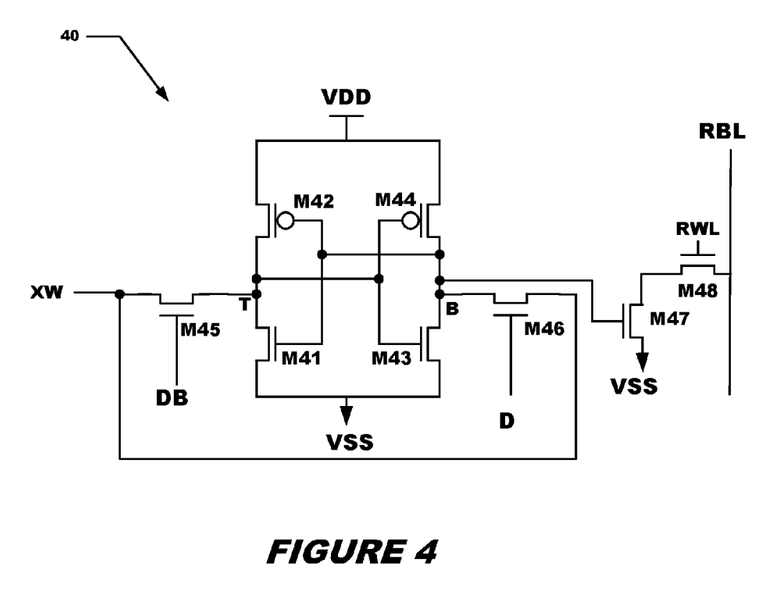
FIG. 4 depicts a schematic diagram of a 1R1W 8T bitcell in accordance with a particular embodiment of the present invention.

The 9T bitcell in FIG. 3 can be modified as shown in FIG. 4. The WWL passgate transistor M39 from FIG. 3 which "acts" as an effective write driver can be taken out of the core array and can be placed in the WD (Wordline Driver) in the periphery. This driver will be common to all the bitcells on a row and needs to be sized accordingly.

Figure 5:
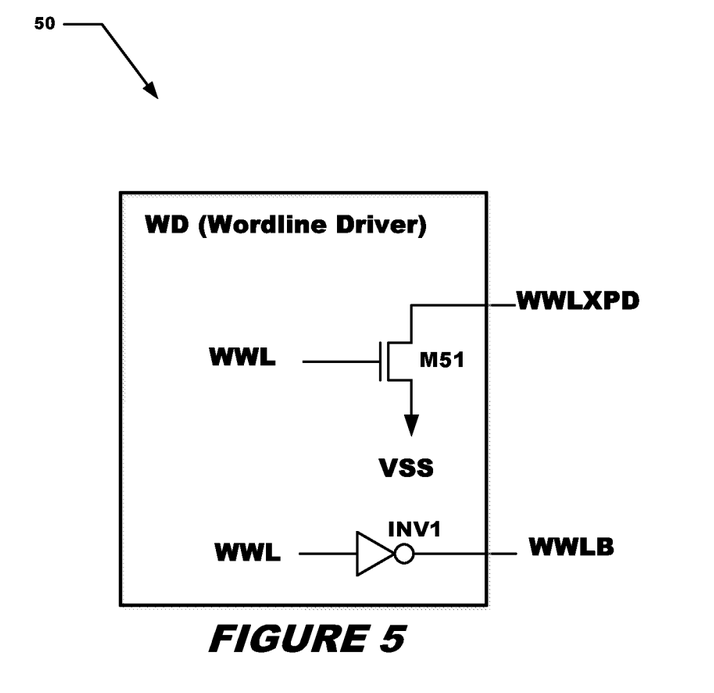
FIG. 5 depicts a schematic diagram of a particular embodiment of a Wordline Driver (WD) in accordance with a particular embodiment of the present invention.
Figure 6:
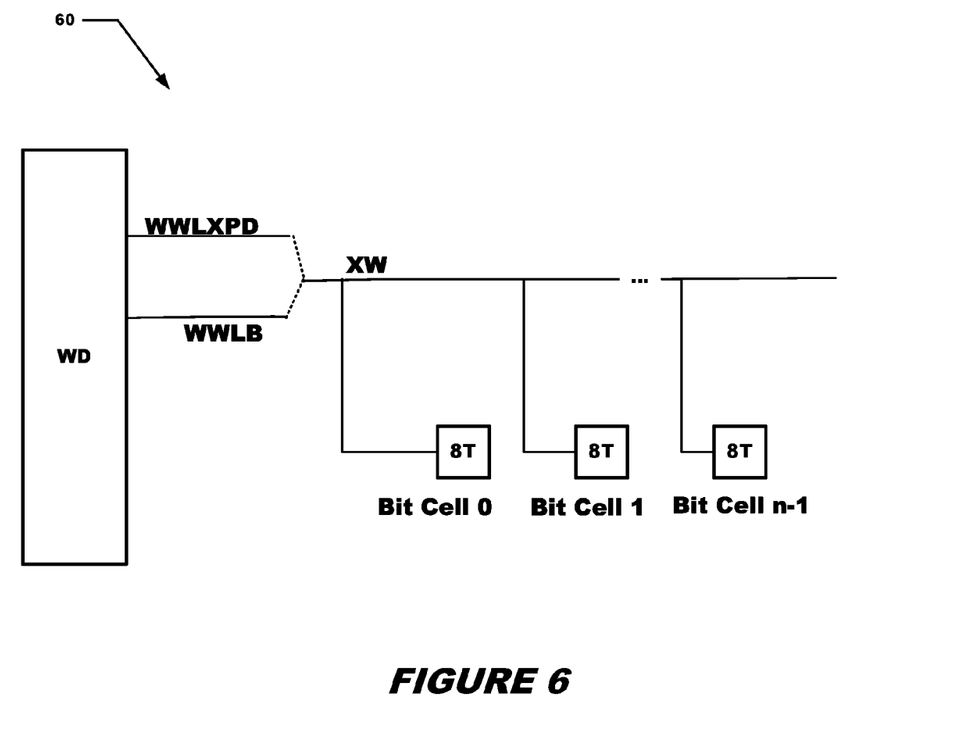
FIG. 6 depicts a block diagram of a particular embodiment of a row of 1R1W 8T bitcells in accordance with a particular embodiment of the present invention.

FIG. 5 shows the generation of signals WWLXPD (Write Word Line Tri-statable Pull Down) and WWLB (Write Word Line Bar) in the leafcell called WD (Wordline Driver). WWLXPD is tri-stated when WWL is "low" and is "zero" when WWL goes high. WWLB is the inverted version of WWL. Based on the design requirements, either WWLXPD or WWLB from FIG. 5 would be connected to the node XW from FIG. 4. FIG. 6 shows the block diagram of a row of 1R1W 8T bitcells driven by either WWLXPD or WWLB.

When WWLXPD is tri-stated, the effective write driver M51 from FIG. 5 is not active and the WRITE operation will not happen. This behavior is very similar to transistor M39 from FIG. 3 being OFF.

When WWLB is "high", please note that a stable bitcell would not change its state. This is due to the fact that the WRITE simply happens by writing a "zero" and not by writing a "one". When WWLB goes "low", a WRITE will happen.

From FIGS. 3, 4, 5, and 6, we can see that the proposed 8T bitcell would be smaller in size as compared to the 9T bitcell. We will have an option of sizing the transistor M51 and invertor INV1 as per the load and speed requirements, without affecting the size of the bitcell.

This 1R1W 8T bitcell from FIG. 4 is very similar to the conventional 8T bitcell as shown in FIG. 2. The differences are in the internal connectivity and the top architecture in which the bitcell is used. Our new architecture gives huge advantages in terms of PPA (Power, Performance, Area) and yield. At the same time, if required, we can use the bitcell available from any foundry just by changing the internal connectivity.

Figure 7:
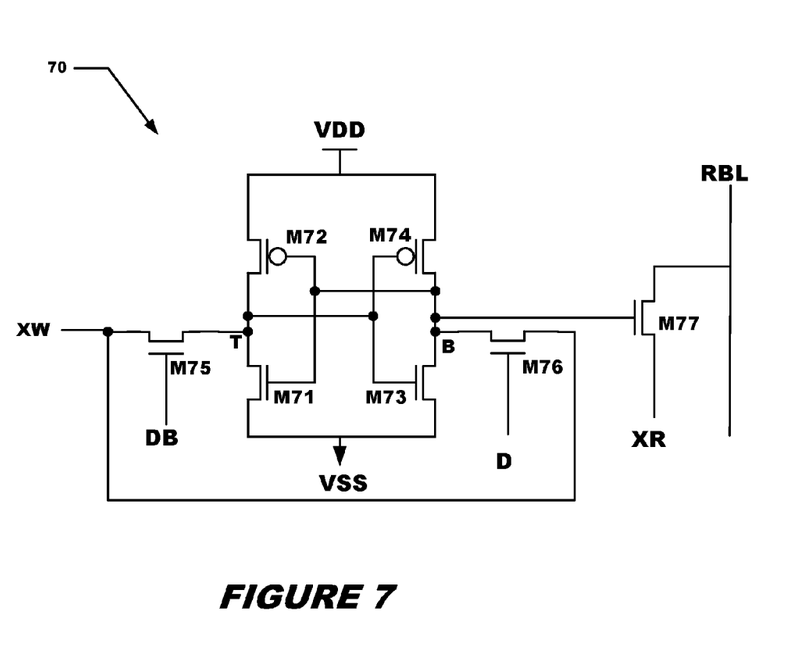
FIG. 7 depicts a schematic diagram of a 1R1W 7T bitcell in accordance with a particular embodiment of the present invention.
Figure 8:
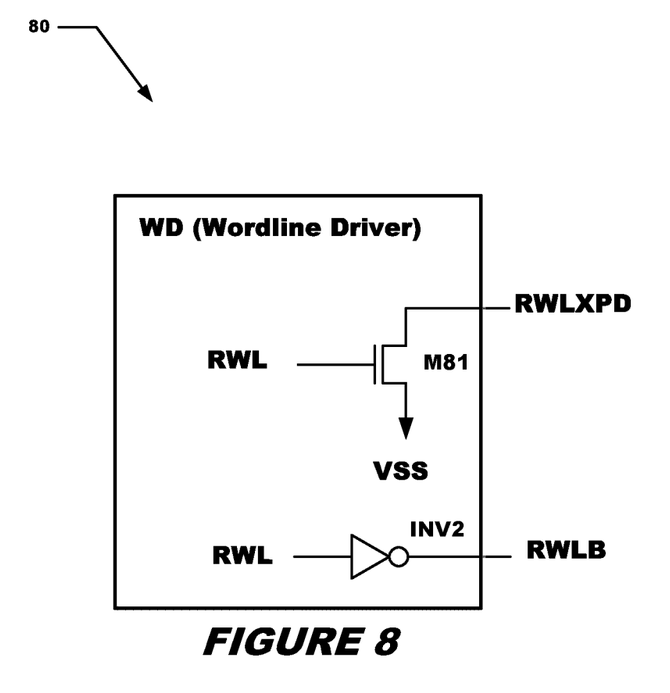
FIG. 8 depicts a schematic diagram of a particular embodiment of a Wordline Driver (WD) in accordance with a particular embodiment of the present invention.

We can also reduce one transistor from the READ port as shown in FIG. 7. The source of the transistor M77 in FIG. 7 which is called XR can be connected to either signal RWLXPD (Read Word Line Tri-statable Pull Down) or to the signal RWLB which is an inverted version of RWL (Read Word Line). FIG. 8 shows the generation of signals RWLXPD and RWLB from the signal RWL.

Transistor M81 in FIG. 8 is now common to all the bitcells in a row and is placed in WD. This transistor M81 can also be replaced by a full invertor INV2. When the RWL goes high (selected), RWLB goes low and provides a path for RBL to discharge, otherwise not. Similarly, RWLXPD will be pulled low when RWL goes high, thereby providing a path for RBL to discharge, otherwise not.

The combination of transistor M77 in FIG. 7 and either transistor M81 or invertor INV2 from FIG. 8 together act in a very similar way as the transistors M47 and M48 in FIG. 4.

Figure 9:
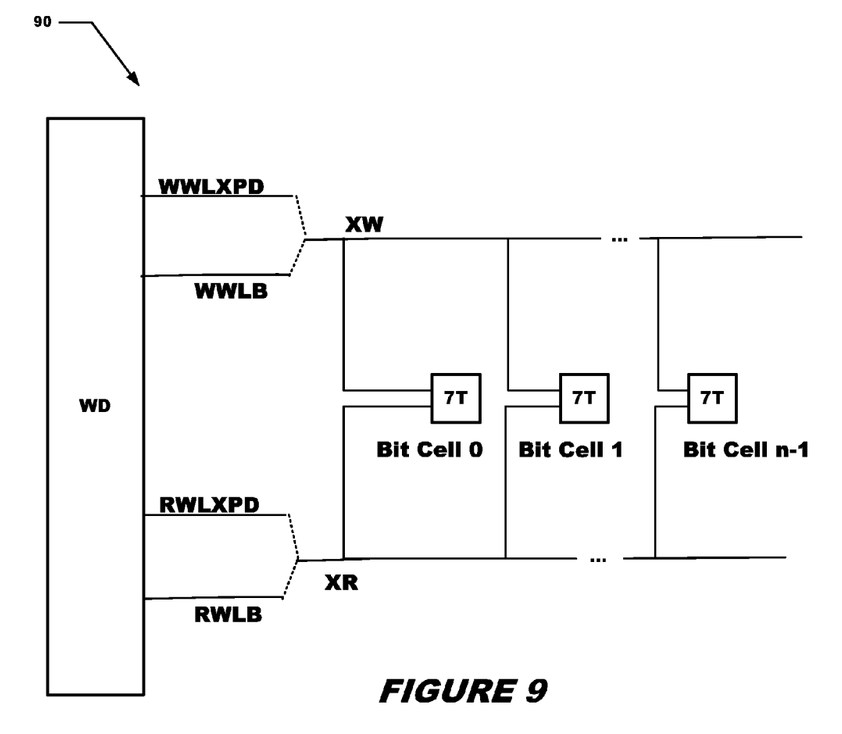
FIG. 9 depicts a block diagram of a particular embodiment of a row of 1R1W 7T bitcells in accordance with a particular embodiment of the present invention.

FIG. 9 shows the block diagram of a row of 1R1W 7T bitcells driven by either WWLXPD or WWLB and RWLXPD or RWLB signals being generated in the leafcell called WD (Wordline Driver). From FIGS. 7, 8, and 9, we can see that the proposed 7T bitcell has most of the advantages of the 9T and 8T bitcells. 7T bitcell would be smaller than both of them. We will have an option of sizing transistors M51, M81 and invertors INV1, INV2 in WD as per the load and speed requirements, without affecting the size of the bitcell.

In the previous patents with Ser. Nos. 62/036,189 and 14/519,468, we have presented a 9T bitcell for 1R1W (One Read One Write) SRAM memories with single-ended read and single-ended write. We have also presented 8T and 7T versions of 1R1W bitcell which can be used in place of 9T bitcell in patent 62/098,460. We have presented 9T, 8T, and 7T versions of single port memory bitcell in patent 62/097,270.

1R1W 9T Bitcell: WD (Wordline Driver) ships out signals WWL (Write Word Line) and RWL (Read Word Line).

1R1W 8T Bitcell: WD (Wordline Driver) ships out signals RWL (Read Word Line) and either WWLXPD (Write Word Line Tri-statatble Pull Down) or WWLB (Write Word Line Bar).

1R1W 7T Bitcell: WD (Wordline Driver) ships out either WWLXPD (Write Word Line Tri-statable Pull Down) or WWLB (Write Word Line Bar) and either RWLXPD (Read Word Line Tri-statable Pull Down) or RWLB (Read Word Line Bar).

Different circuits are needed to support different bitcells and architectures mentioned above.

When we go from 9T to 8T to 7T bitcells, the bitcell area reduces. Also, as the WWLB and RWLB invertors, or the WWLXPD and RWLXPD transistors can be sized as per the design requirements, we can optimize the READ and WRITE performance.

Figure 10:
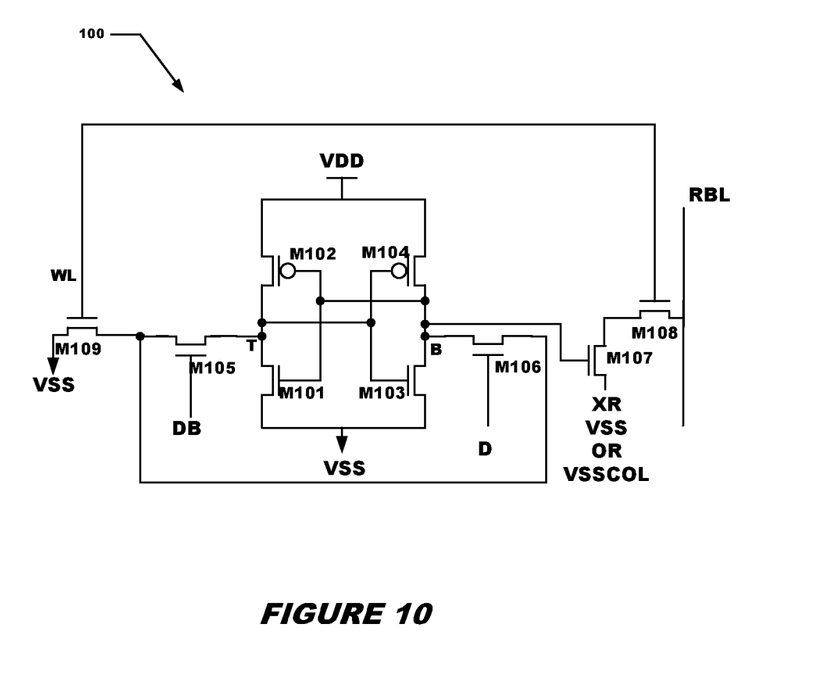
FIG. 10 depicts a schematic diagram of a single port 9T bitcell in accordance with a particular embodiment of the present invention.

Referring to FIG. 10 which shows the single port 9T bitcell, we have connected WWL (Write Word Line) and RWL (Read Word Line) from FIG. 3 to form a single wordline WL. This converts the bitcell into a single port bitcell. The source of the transistor M107 is now called XR which van be connected either to VSS or VSSCOL. In FIG. 3, it was always connected to VSS. This is one more change in FIG. 10 as compared to FIG. 3.

During the write cycle, either DB or D will go high so that a write happens. During a read cycle, both D and DB will be kept low so that any write operation does not happen.

Figure 11:
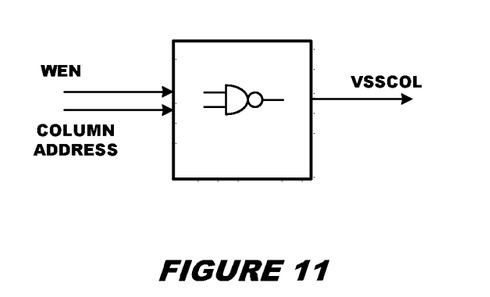
FIG. 11 depicts a schematic diagram of a VSSCOL control circuit in accordance with a particular embodiment of the present invention.

If the node X is connected to VSS as in a conventional 8T bitcell and when the WL goes high, current will flow from RBL to VSS if the node "B" is high. To avoid this, the current patent suggests that the VSSCOL can be made a function of WEN (Write Enable) and the column address so that VSSCOL is low only during a read cycle and only when the corresponding column is selected. During a write cycle and during a read operation for the unselected columns, VSSCOL will stay high. This way, the read current will not flow and the bitline leakage will reduce almost to zero. FIG. 11 shows a representative scheme of generating the VSS-COL signal.

The bitcell shown in FIG. 10 will have all the advantages of the bitcell shown in FIG. 3. In addition, it has enabled a scheme that will save the dynamic power and the leakage power from being spent on the unselected RBL (Read Bit Lines).

Figure 12:
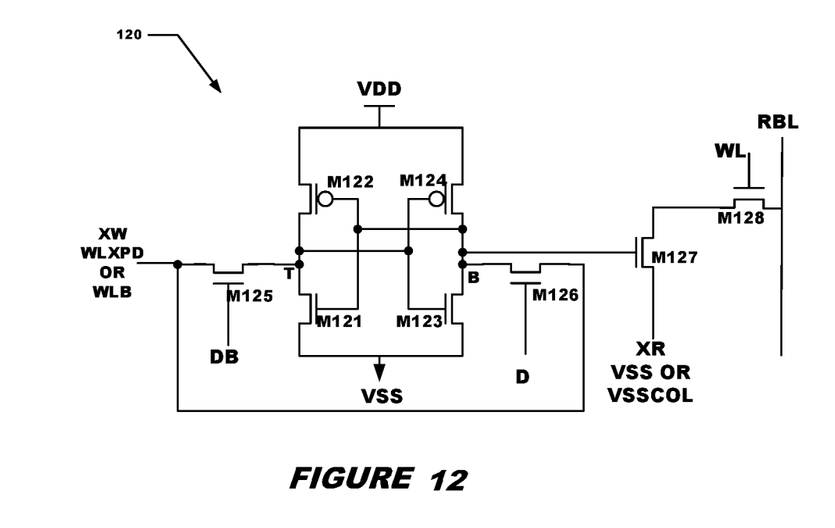
FIG. 12 depicts a schematic diagram of a single port 8T bitcell in accordance with a particular embodiment of the present invention.

FIG. 12 shows the 8T bitcell for single port SRAM with single ended read and single ended write. This bitcell is very similar to the 8T bitcell shown in FIG. 4. As there is now only single wordline, we do not have WWL and RWL, but we have only WL. The source of the transistor M127 is now called XR which can be connected either to VSS or VSSCOL. In FIG. 4, it was always connected to VSS. This is one more change in FIG. 12 as compared to FIG. 4.

Figure 13:
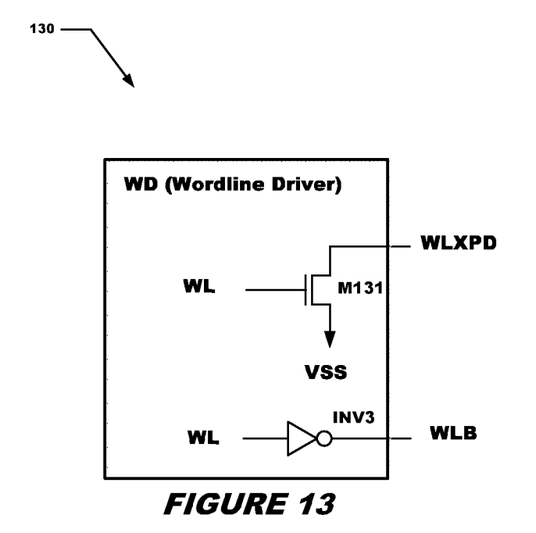
FIG. 13 depicts a schematic diagram of a particular embodiment of a Wordline Driver (WD) in accordance with a particular embodiment of the present invention.

FIG. 13 shows the generation of WLXPD and WLB in the leafcell called WD. These signals are used to drive a row of single port 8T and single port 7T bitcells.

The difference between the single port 9T bitcell and the single port 8T bitcell is that the transistor M109 in FIG. 10 is now put in the WD circuit outside the core array as transistor M131 in FIG. 13. Note that M131 is common to the whole row. The size of the transistor M131 and invertor INV3 needs to be adjusted as per the load and the speed requirements.

Figure 14:
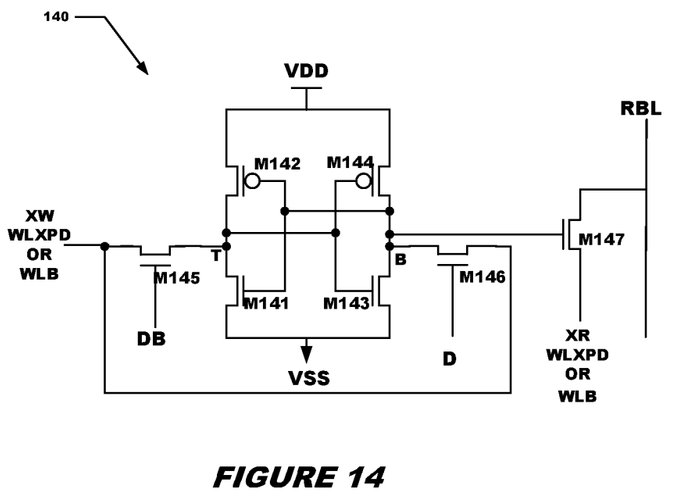
FIG. 14 depicts a schematic diagram of a single port 7T bitcell in accordance with a particular embodiment of the present invention.

FIG. 14 shows the proposed 7T bitcell for single port SRAM with single ended READ and single ended WRITE. The 7T bitcell has one less transistor than the conventional 8T bitcell. It still has most of the advantages of the 9T or 8T bitcells described earlier. As the wordline WL is now same for the READ and WRITE, it will consume the read current during the WRITE cycle also if the node B is high. This is actually not much different than what happens in a conventional 6T single port bitcell.

The 7T single port bitcell in FIG. 14 looks exactly the same as the 7T 1R1W bitcell in FIG. 5. The difference is in how they are connected to the external signals. In 1R1W, XW is connected to either WWLXPD or WWLB and XR is connected to either RWLXPD or RWLB. In single port architecture, both XW and XR are connected to either WLXPD or WLB. Rest of the functionality of the bitcell is same.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

What is claimed is:

1. A memory architecture comprising:
a plurality of transistors arranged to form a bit cell, said bit cell comprising a first transistor, a second transistor, a third transistor and a fourth transistor configured to store a bit of data;
a fifth transistor having a gate coupled to a Data Bar (DB) signal, said fifth transistor having a drain coupled to a drain of said first transistor and a Source coupled to an XW signal;
a sixth transistor having a gate coupled to a Data (D) signal, a drain coupled to a drain of said third transistor and a source coupled to a source of said fifth transistor;
a seventh transistor having a gate coupled to said drain of said sixth transistor, and a source coupled to ground signal, wherein said ground signal comprises one of VSS or VSSCOL, wherein said VSSCOL signal comprises a signal resulting from a logical NAND of a Write Enable (WEN) signal and a Column address; and
an eighth transistor having a gate coupled to a Read Word Line (RWL) signal, a source coupled to a drain of said seventh transistor and a drain coupled to a Read Bit Line (RBL) signal.

2. The memory architecture of claim 1 wherein said bit cell comprises:
said first transistor of said plurality of transistors having a gate coupled to a gate of said second transistor of said plurality of transistors, a drain of said third transistor of said plurality of transistors, and a drain of said fourth transistor of said plurality of transistors, said first transistor having a source connected to said ground and a drain coupled to a drain of said second transistor, a gate of said third transistor and a gate of said fourth transistor;
said second transistor having a source coupled to a positive reference voltage;
said third transistor having a source connected to said ground; and
said fourth transistor having a source coupled to said positive reference voltage.

3. The memory architecture of claim 1 wherein to perform a write of data into said bit cell said XW line goes low and one of said D line or said DB line goes high, and wherein said write takes place without any need of a write bit line or a write driver or a write bitline precharge.

4. The memory architecture of claim 1 wherein said RBL line is precharged high and to perform a read of data from said bit cell said Read Word Line (RWL) signal goes high.

5. The memory architecture of claim 2 wherein said first transistor and said third transistor comprise NFETs and wherein said second transistor and said fourth transistor comprise PFETs.

6. The memory architecture of claim 1 and wherein said fifth transistor, said sixth transistor, said seventh transistor, and said eighth transistor comprise NFETs.

7. The memory architecture of claim 1 wherein said XW signal is derived from a Write Word Line (WWL) signal.

8. The memory architecture of claim 1 wherein said Read Word Line (RWL) signal comprises one of an RWL signal (as used in One Read One Write (R1W1)) or a Word Line (WL) signal (as used in single port).

9. The memory architecture of claim 1 wherein said D and DB lines encode a data polarity as well as column decode information.

10. The memory architecture of claim 1 wherein a whole row does not go active for writing, wherein only a cross-over bitcell where the WWL or WL and D or DB lines are ON, goes active for writing.

11. The memory architecture of claim 1 wherein only one side of the bitcell is accessed during write operation where the "write zero" operation is expected to happen.

12. The memory architecture of claim 1 wherein bitcell access is controlled by combining a row address, a column address, and data polarity information to uniquely determine a bitcell as well as a side of said bitcell that is accessed during write.

* * * * *